United States Patent
Schilling

(10) Patent No.: US 7,489,841 B2
(45) Date of Patent: Feb. 10, 2009

(54) DEVICE FOR TRANSFERRING OPTICAL SIGNALS BY MEANS OF PLANAR OPTICAL CONDUCTORS

(75) Inventor: Harry Schilling, Eichstaett (DE)

(73) Assignee: Schleifring und Apparatebau GmbH, Fuerstenfeldbruck (DE)

( * ) Notice: Subject to any disclaimer, the term of this patent is extended or adjusted under 35 U.S.C. 154(b) by 217 days.

(21) Appl. No.: 10/462,385

(22) Filed: Jun. 16, 2003

(65) Prior Publication Data

US 2004/0252943 A1 Dec. 16, 2004
US 2008/0107378 A9 May 8, 2008

Related U.S. Application Data

(63) Continuation of application No. PCT/DE01/04575, filed on Dec. 7, 2001.

(30) Foreign Application Priority Data

Dec. 22, 2000 (DE) ................ 200 21 834
Feb. 2, 2001 (DE) ................ 101 06 297
Jun. 8, 2001 (WO) .............. PCT/DE01/02120

(51) Int. Cl.
  *G02B 6/34* (2006.01)
(52) U.S. Cl. .................. 385/37; 385/129; 385/131
(58) Field of Classification Search ......... 385/129–132, 385/37
See application file for complete search history.

(56) References Cited

U.S. PATENT DOCUMENTS

| | | | |
|---|---|---|---|
| 4,081,672 A | 3/1978 | Caspers et al. | |
| 4,346,961 A | 8/1982 | Porter | |
| 4,371,897 A | 2/1983 | Kramer | |
| 4,640,592 A | 2/1987 | Nishimura et al. | |
| 4,733,929 A | 3/1988 | Brown | |
| 4,739,501 A | 4/1988 | Fussgaenger | |
| 4,749,248 A | 6/1988 | Aberson, Jr. et al. | |
| 4,773,063 A | 9/1988 | Hunsperger et al. | |
| 4,867,522 A | 9/1989 | Cassidy | |
| 5,058,975 A | 10/1991 | Sudo | |
| 5,070,488 A * | 12/1991 | Fukushima et al. | 369/44.12 |
| 5,257,329 A | 10/1993 | Blyler, Jr. et al. | |
| 5,361,320 A | 11/1994 | Liu et al. | |

(Continued)

FOREIGN PATENT DOCUMENTS

DE 4124863 1/1993

(Continued)

OTHER PUBLICATIONS

International Search Report, PCT/DE01/04575, mailed Sep. 24, 2003.

(Continued)

*Primary Examiner*—Kevin S Wood
(74) *Attorney, Agent, or Firm*—Kevin L. Daffer; Daffer McDaniel, LLP

(57) ABSTRACT

What is described here is a method of or a device for transferring optical signals. An optical conductor including a light-conducting core, which has at least two parallel interfaces provided with coatings that result in a reflection of the light guided in the light-conducting core, comprises at least one means for coupling the emitter or the receiver, respectively, by diffraction, refraction or diffusion.

18 Claims, 2 Drawing Sheets a)          b)

U.S. PATENT DOCUMENTS

| | | | |
|---|---|---|---|
| 5,854,865 | A | 12/1998 | Goldberg |
| 5,881,200 | A | 3/1999 | Burt |
| 5,974,212 | A | 10/1999 | Saeki |
| 6,058,226 | A | 5/2000 | Starodubov |
| 6,075,915 | A | 6/2000 | Koops et al. |
| 6,104,852 | A | 8/2000 | Kashyap |
| 6,122,024 | A | 9/2000 | Molsen et al. |
| 6,438,298 | B1 | 8/2002 | Matsui et al. |
| 2003/0068130 | A1* | 4/2003 | Gao ............................ 385/37 |
| 2005/0047705 | A1* | 3/2005 | Domash et al. ............... 385/10 |

FOREIGN PATENT DOCUMENTS

| | | |
|---|---|---|
| DE | 42 05 750 | 8/1993 |
| DE | 4314031 | 11/1994 |
| DE | 4329914 | 3/1995 |
| DE | 9007809 | 1/1997 |
| DE | 19634893 | 5/1997 |
| EP | 0 416 989 | 11/1993 |
| GB | 1 527 228 | 10/1978 |
| GB | 2 266 160 | 10/1993 |
| JP | 59-32961 | 2/1984 |
| JP | 61-281206 | 12/1986 |
| JP | 2-113708 | 4/1990 |
| JP | 2-131201 | 5/1990 |
| JP | 7-140338 | 6/1995 |
| JP | 2001-33743 | 2/2001 |
| WO | 99/04309 | 1/1999 |
| WO | 99/57584 | 11/1999 |
| WO | 00/36979 | 6/2000 |

OTHER PUBLICATIONS

Griese, "Leiterplatten der naechsten Generation: GHz-Bandbreiten durch optische Verbindungstechnik," © 2000 Fachverband Elektronik-Design, pp. 99-118.

Backlund et al., "Multifunctional Grating Couplers for Bidirectional Incoupling into Planar Waveguides," IEEE Photonics Technology Letters, © 2000 IEEE, pp. 314-316.

Saliminia et al., "First- and Second-Order Bragg Gratings in Single-Mode Planar Waveguides of Chalcogenide Glasses," Journal of Lightwave Technology, vol. 17, No. 5, May 1999, pp. 837-842.

* cited by examiner

DEVICE FOR TRANSFERRING OPTICAL SIGNALS BY MEANS OF PLANAR OPTICAL CONDUCTORS

CONTINUING DATA

The present application is a continuation of pending International Application No. PCT/DE01/04575 filed Dec. 7, 2001, which designates the United States and claims priority from pending German Applications Nos. 20021834.4 filed Dec. 22, 2000 and 10106297.4 filed Feb. 2, 2001; and PCT Application No. PCT/DE01/02120 filed Jun. 8, 2001.

FIELD OF THE INVENTION

The present invention relates to a device for or a method of optical signal transfer, respectively. To this end, light is coupled or decoupled at different sites of a preferably planar optical conductor.

PRIOR ART

For the transfer of optical signals over short distances, frequently optical-fiber cables are also used in other configurations, in addition to the known light-conducting fibers. For example, two-dimensional or planar optical-fiber cables have become known for connecting components or modules. Such optical-fiber cables are also used in hybrid components or modules, in combination with electrical conductor structures. This is particularly expedient because in such a case the electrical signals can be supplied, on the one hand, which are necessary for the operation of the active electronic components, and, on the other hand, a reliable noise-immune and wide-band communication via the optical-fiber cables becomes possible by optical means.

For reasons of clarity in the description, the following statements refer always to the term of "planar optical-fiber cables". This term does not exclusively refer to complete planar structures but is rather meant to cover exclusively those regions of the structures, which are envisaged for light conduction. Hence this term also encompasses a system composed of several planar optical conductors that are made of a single piece and comprise impressions for decoupling between the various light paths. Here, only the light-conducting zone but no longer the complete structure is of a planar configuration. Moreover, reference is made to the German Utility Model DE 200 21 834.4. The essence of this Utility Model is also meant to constitute part of the present patent application.

Such planar optical conductors, to which the present invention relates, comprise at least one light-conducting core that comprises at least two parallel interfaces. These interfaces, in their turn, present coatings that result in a reflection of the light guided in the light-conducting core. The invention does not relate to optical conductors without coatings of the core, wherein this core is surrounded by air, for example, as these optical conductors are not suitable for reliable application specifically in densely packed or highly integrated components or modules. It must be permanently ensured that there is a sufficient distance from the light-conducting core to the environment. Furthermore, the light-conducting core is highly sensitive to soiling or mechanical damage, respectively. The coatings of the parallel interfaces render the array largely independent of external influences. As a matter of fact, however, it is also substantially more difficult to couple and decouple light in such arrangements.

The German Utility Model DE 90 07 809 describes a high-precision measuring means including a planar optical-fiber cable. This measuring means is based, as a matter of fact, on a principle of direct light conduction without reflections. The optical-fiber cable serves here to convey the light from a laser interferometer to an optical detector. In order to allow for the detection of variations of path lengths in the order of the wavelength of the light by means of a laser interferometer it is necessary that the optical path throughout the system be constant at least in the order of a wave-length of the light or even fractions thereof. The optical-fiber cable described there is therefore designed for an indirect propagation of the light coupled through an optical grating into the optical-fiber cables towards the receiver. If reflections of the conveyed light would occur on surfaces in that optical conductor the angle of reflection and hence the number of reflection events or the optical path, respectively, would be strongly dependent on the angle of incidence of the light coupled onto the optical-fiber cable. Then a high-resolution measurement of the angle could be implemented but a reliable measurement of the distance could by no means be realized. By contrast, the invention relates to optical fiber cables in which several multiple reflections are possible on interfaces of the light-conducting core. As a result, a far-reaching independence from the optical angles of the coupling or decoupling elements is achieved with respect to the core, along with a higher efficiency, as light, too, can be transmitted at different angles.

In the known hybrid components or modules, in which electrical or optical functions are integrated the light is preferably coupled or decoupled, respectively, on the optical components such as LEDs, laser diodes or photodiodes become possible. Specifically in densely packed arrays, it is not possible to couple the light into the optical conductor on the face ends. In any case, expensive solutions are required here which operate on optical or micro-optical elements such as micro lenses, mirrors or prisms.

An illustration of the present state of the art can be found in "Fachverband Elektronik-Design (FED) 2000", Transactions Electronic Design 2000 & Component Production 2000, pages 110 to 117.

Moreover, the reference "Multifunctional Grating Couplers for Bidirectional In-Coupling into Planar Waveguides" by Bafcklu8nd, Johan, et al., in: IEEE Photonics Technology Letters, vol. 12, No. 3, March 2000, pages 314 to 316 describes an optical grating for coupling light into a planar wave guide. His arrangement, however, is unsuitable for the practical application in highly integrated systems because in that case the coupling of light is described exclusively. The problem of light decoupling is not solved or must take place on face sides of the optical-fiber cable in correspondence with prior art.

BRIEF DESCRIPTIONS OF THE INVENTION

Therefore, the problem arises to provide a device or a method, respectively, for coupling optical components to preferably planar optical-fiber cables, wherein light decoupling, too, is possible in addition to light coupling at any sites desired.

In accordance with the invention, the problem is solved with the means defined in the independent claims. Expedient improvements of the invention are the subject matters of the dependent further claims.

In correspondence with the invention, a device for the transfer of optical signals, which comprises at least one optical conductor, at least one source for the emission of light, at least one receiver for receiving light and at least one means for coupling the source and the receiver to the optical conductor, is designed in such a way that the means for coupling comprises or comprise optical gratings for redirecting the light by diffraction. The optical conductor consists of at least one light-conducting core that includes at least two parallel interfaces provided with coatings. The core may present any structure desired that is, for instance, homogeneous, presents a stepped index profile or a gradient index profile. The light is conducted by reflections of the light guided in the light-conducting core on the interfaces or the coatings, respectively. The core, in its turn, is preferably designed as solid light-conducting body such as glass or Plexiglas. It may equally consist, however, of a liquid or a gaseous medium. As used in this document, the terms of the source or the receiver, respectively, relate generally to light sources or light sinks, respectively. In the case of sources, for instance, they may be various emitters in the form of LEDs, laser diodes or even incandescent lamps. With respect to the receivers, there are not any limitations so that they may also be photodiodes or even the human eye, for example. With respect to the inventive device, any means for conveying light or for guiding or shaping a beam of light may equally be considered as light source, such as light-conducting fibers conveying the light from a distant light source to the inventive device. The essential aspect of the invention is the fact that light is introduced from the outside (source) and that light can also be emitted to the outside (receiver).

In a particularly expedient embodiment of the invention, at least one optical grating is provided on the outside of a coating. Such an optical grating permits only the coupling of light into the light-conducting core only on the outside of a coating. Such an element, however, can be employed in combination with other inventive elements for decoupling light with appropriate elements.

In a further expedient embodiment of the invention, at least one optical grating is provided on an interface of the light-conducting core. Due to such an arrangement on an interface of the light-conducting core, it is not only possible to couple light into the light-conducting core but also to decouple the light. In combination with such embodiments, such a complete transfer of light between a source and a receiver is possible. Compared against the arrangement of an optical grating on the outside of a coating, an arrangement of an optical grating on an interface of the light-conducting core offers the advantage of higher sturdiness and reliability because here the optical grating is additionally protected by a coating above it. Hence any contact from the outside and soiling are precluded. Moreover, this embodiment has a lower loss throughout the system than an arrangement of an optical grating on the outside of a coating. In the latter case, light orthogonally incident from the outside is deflected by the optical grating into an oblique angle, which can be conducted in the core, already on the outside of the coating. In this configuration, it passes through the coating at a comparatively flat angle and hence over a comparatively long distance. As a rule, the coating presents a definitely stronger attenuation than the core. When the light enters orthogonally through the coating is deflected only on the surface of the core it passes through a substantially shorter path distance in the coating and is hence subjected to a lower attenuation. This creates a positive effect on the performance balance of the overall transfer system.

When the coating contains a material that presents reflecting properties, in its turn, either the optical grating as such must be incorporated into this coating, which can be realized, for instance, in the form of perforations, or a recess must be provided in the coating at the site of the optical grating.

An optical grating on the interface of the light-conducting core can preferably be manufactured in a single operation, together with the surface of the core. It is possible, for instance, to impress the optical grating already by means of a die that shapes the contour of the surface at the same time.

In another expedient embodiment of the invention, at least one optical grating is embedded in a coating. With the optical grating being embedded into the coating, it is possible to achieve, on the one hand, a mechanical protection of the optical grating and, on the other hand, also a lower attenuation than that achieved with an arrangement of the optical grating on the surface of the coating. Such an arrangement, too, can be expediently manufactured when the core must be produced in a separate independent process. Then, the optical grating is applied together with the coating in a second process step.

Another embodiment of the invention provides for at least one optical grating that is embedded into the core. This embedding into the core permits the manufacture in a single production step and offers an optimum protection from external influences.

In a further expedient embodiment of the invention at least one additional optical grating is embedded into the core for deflection of the light. In complex light-conducting systems in particular it may be desirable that the light is guided not only in a straight direction but also through curves or around curves or corners, respectively. This is possible with optical gratings for light deflection in the core. This design equally permits the implementation of a subdivision of light beams into several partial beams.

Another expedient embodiment of the invention consists in the aspect that at least one optical grating is fixed at predetermined positions. Such optical gratings are hence manufactured already by the manufacturing process at defined predetermined positions. They excel themselves by a high mechanical stability and sturdiness.

In a further expedient embodiment of the invention, at least one optical grating has a reversible design. Depending on the requirements and demands on the instantaneous operating condition, such a reversible optical grating can be activated or deactivated. If the optical grating is activated at a defined site coupling or decoupling is possible at this site; if the optical grating is deactivated coupling or decoupling is no longer possible. Hence, the distribution of the light from various emitters to various receivers may be controlled. When a reversible optical grating is integrated into the core for light deflection the direction of the light or the distribution of the beam can be controlled by the optical grating as well. As far as the reversible optical grating is concerned reference is made to the international publication WO 99/04309 whose essence is also incorporated as an element into the present patent application.

A further expedient configuration consists in the provision that at least one reversible optical grating can be activated or deactivated by means of a signal or by the supply of energy, respectively. As a result, controllable optical gratings are achieved that may be used to implement an active control of the optical signal flow. Hence, the supply of light to or from defined receivers or emitters, respectively, can be controlled.

In another expedient embodiment of the invention, at least one optical grating consists of liquid crystals. Liquid crystals permit the implementation of controllable or reversible optical gratings in a particularly simple manner.

Another expedient configuration of the invention consists in the provision that the means for coupling comprise diffusing centers for light deflection by means of diffusion. Various types of the diffusing centers such as particles of a different material or zones of a different state of the core material, e.g.

in a different crystal structure, or of a different state of matter, e.g. in the form of small gas bubbles in a liquid, are suitable for diffusing the light. As far as the configuration by means of diffusing centers reference is also made to the preceding description of the optical gratings.

Another expedient embodiment of the invention consists in the aspect that at least one zone with diffusing centers is provided in a coating. This permits a particularly simple manufacture.

In a further expedient embodiment of the invention, at least one zone with diffusing centers is provided in the core. This provision allows for particularly efficient coupling.

Another expedient embodiment of the invention provides for a zone with additional diffusing centers for deflection of the light in the core.

A further expedient embodiment of the invention provides for at least one diffusing center fixed at a predetermined position.

In another particularly expedient embodiment of the invention, at least one diffusing center is of a reversible design and can be activated or deactivated, respectively, by means of a signal or by the supply of energy.

In a further expedient embodiment of the invention, at least one diffusing center is made of liquid crystals. In this case, the orientation of the liquid crystals and hence the diffusion effect can be controlled in a particularly simple manner.

In another particularly expedient embodiment of the invention, the means for coupling encompass elements or structures presenting an index of refraction different from the refractive index of the core for deflecting the light by refraction. As far as the configuration by means of different indices of refraction is concerned reference is also made to the description of the optical gratings or the diffusing centers, respectively, which is set out above.

Another expedient embodiment of the invention provides for at least one recess in the light-conducting core, which is filled with a material that has an index of refraction different from the refractive index of the core. This results in an orientation at the junction between the core and the material. The material having a different index of refraction may be a solid, a liquid or even a gaseous material. It may also be a material whose index of refraction varies in response to electrical signals or the supply of energy, respectively.

Another expedient embodiment of the invention provides for at least one zone having an index of refraction different from the refractive index of the core for the deflection of the light in the core. In this manner, it is possible to implement control of the light or of the orientation within the core.

In another embodiment of the invention, at least one coating presents reflecting characteristics. Hence, a reflection on the coating material is used to guide the light in the core.

A further embodiment of the invention comprises at least one coating that has an index of refraction different from the refractive index of the core. This provision permits the conduction of the light in the core by total reflection of the light on the interface between the core and the coating. In the case of a core made of a synthetic resin, for example, the coating may consist of a different synthetic resin having a different index of refraction. The coating may, of course, also present a gradient profile of the index of refraction.

An inventive method serves to couple at least one source for the emission of light and at least one receiver for receiving light to at least one preferably planar optical conductor. This optical conductor comprises a light-conducting core having at least two parallel interfaces in the regions provided for the conduction of light, which are provided with coatings resulting in a reflection of the light guided in the light-conducting core. Here, coupling is realized by at least one means for coupling the source or the receiver, respectively to the optical conductor, with at least one optical grating being employed for redirecting the light by diffraction.

Another method serves to couple at least one source for the emission of light and at least one receiver for receiving light to at least one preferably planar optical conductor. There, this optical conductor comprises a light-conducting core having at least two parallel interfaces in the regions provided for the conduction of light, which are provided with coatings resulting in a reflection of the light guided in the light-conducting core. Coupling is realized by at least one means for coupling the source or the receiver, respectively, to the optical conductor, using at least one diffusing center for redirecting the light by diffusion.

A further inventive method serves to couple at least one source for the emission of light and at least one receiver for receiving light to at least one preferably planar optical conductor. There, this optical conductor comprises a light-conducting core that has at least two parallel interfaces in the regions provided for the conduction of light, which are provided with coatings resulting in a reflection of the light guided in the light-conducting core. Here, coupling is realized by at least one means for coupling the source or the receiver, respectively, to the optical conductor, using at least one element connected to the light-conducting core, which has an index of refraction different from the refractive index of the core, for redirecting the light by refraction.

DESCRIPTION OF THE DRAWINGS

In the following, the invention will be described by exemplary embodiments, without any restriction of the general inventive idea, with reference to the drawings.

FIG. 1 shows a longitudinal section taken through an electro-optical printed-circuit board in hybrid design, which includes two electrical layers 1 between which an optical layer 2 is sandwiched. The latter comprises a light-conducting core 4 that is enclosed by two parallel coatings 3 on the interfaces. For coupling light by means of a light source 6, a discontinuity 5 is provided in the conductive layer. It is equally possible to use a conductive material having permeable characteristics for the wavelength used to transfer the light. In this case, a discontinuity is not required in this conductive layer.

At the position of the discontinuity 5, a means is provided for coupling the light. This means may optionally comprise an optical grating, diffusing centers or a material having a different index of refraction.

Figure 1:
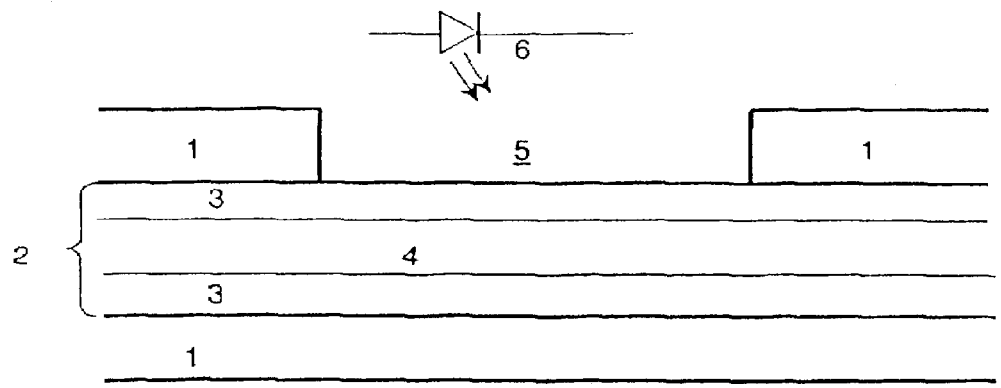
FIG. 1 shows a preferred embodiment of the invention in the form of a hybrid printed-circuit board.
Figure 2:
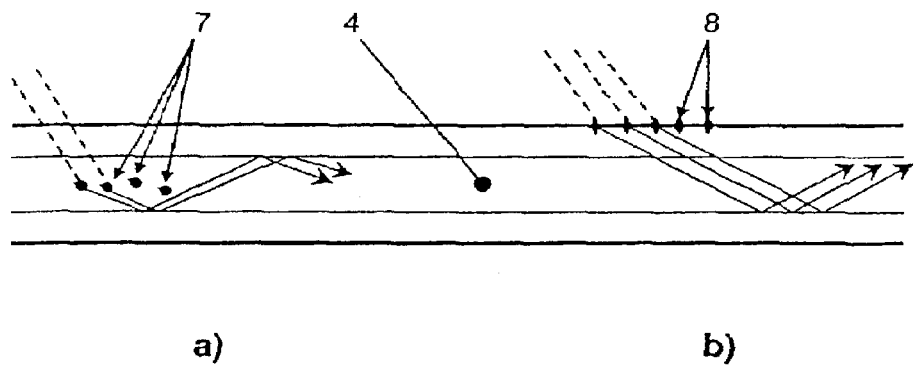
FIG. 2 is an exemplary view of one embodiment of the invention, which comprises diffusing centers or an optical grating structure for coupling light.

FIG. 2 shows a schematic view of the process of coupling light through diffusing centers or optical gratings, respectively. In part (a), a process of coupling by means of diffusing centers 7, is shown, which is provided in the core. Light is incident on these diffusing centers and is deflected into different directions. One part of the light is deflected at angles that permit a conduction of light within the core. The further conduction of light is realized by reflection on the interfaces of the core with the coating. Part (b) illustrates the process of coupling by means of an optical grating 8. There, incident light is deflected by diffraction on the optical grating at angles that may be conducted within the core. This configuration does not allow for light decoupling by means of the optical grating because the light, which is guided within the core, does not reach the optical grating because it is reflected before on the interface with the coating. When the optical grating is now provided on the outside of the core, rather than on the outside of the coating, as is illustrated in FIG. 2(b), the light that is guided in the core may be incident on this optical grating, too, and may undergo a corresponding deflection. In this manner, it is also possible to decouple light.

Figure 3:
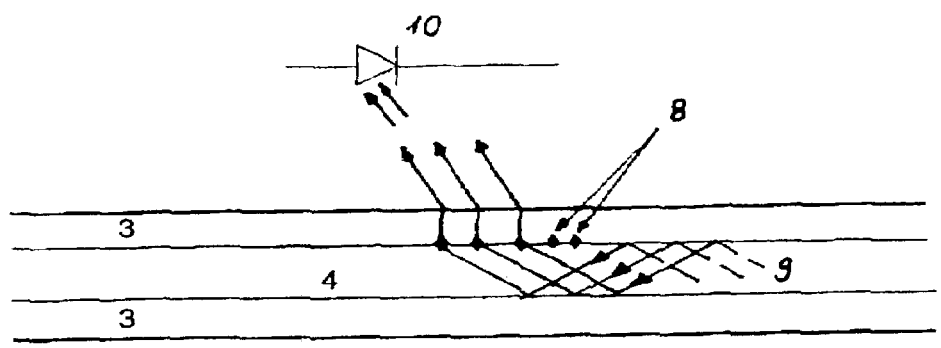
FIG. 3 illustrates an exemplary embodiment of the invention, which comprises an optical grating structure on the light-conducting core.

FIG. 3 shows an exemplary configuration of the invention, which comprises a grating structure on the light-conducting core.

The light-conducting core 4 is provided with coatings 3 on its parallel interfaces. An optical grating (8) for diffraction of the light is applied directly on an interface of the core. Light 9, which propagates in the light-conducting core and is incident on the optical grating, may now be deflected into regions outside the light-conducting core. This is detected, for instance, by means of a receiver 10.

The invention claimed is:

1. Device for transferring optical signals, comprising:
    at least one preferably planar optical conductor having a light-permeable section within at least a portion of a planar region of the conductor composed of a light-conducting core having at least two parallel interfaces extending along the planar region, wherein said interfaces are provided with coatings resulting in a reflection of light guided in the light-conducting core;
    at least one source for the emission of light through the light-permeable section;
    at least one receiver for receiving light through the light-permeable section; and
    at least one means for coupling said source or said receiver, respectively, to said optical conductor, wherein said means comprises optical coupling gratings for redirecting the light by diffraction, and said at least one of the optical gratings is embedded in said core.

2. Device according to claim 1, wherein at least one of the optical coupling gratings is provided on the outside face of at least one of the coatings.

3. Device according to claim 1, wherein at least one of the optical coupling gratings is provided on an interface of said light-conducting core.

4. Device according to claim 1, wherein at least one additional optical coupling grating is embedded in said core for redirecting the orientation of the light.

5. Device according to claim 1, wherein at least one of the optical coupling gratings is fixed at predetermined positions.

6. Device according to claim 1, wherein at least one of the optical coupling gratings is configured in a reversible design.

7. Device according to claim 1, wherein at least one of the optical coupling gratings is configured in a reversible design and is adapted to be activated or deactivated, respectively by means of a signal or by the supply of energy, respectively.

8. Device according to claim 1, wherein at least one of the optical coupling gratings is made of liquid crystals.

9. Device according to claim 1, wherein said means for coupling comprises diffusing centers for redirecting the light by means of diffusion.

10. Device according to claim 1, wherein at least one zone with diffusing centers is provided in a coating.

11. Device according to claim 1, wherein at least one zone with diffusing centers is provided in said core.

12. Device according to claim 1, wherein at least one zone with additional diffusion centers is provided in said core for deflection of the light.

13. Device according to claim 1, wherein at least one diffusing centre is fixed at predetermined positions.

14. Device according to claim 1, wherein at least one diffusing centre is configured as a reversible design and is adapted to be activated or deactivated, respectively, by means of a signal or by the supply of energy, respectively.

15. Device according to claim 1, wherein at least one diffusing centre is made of liquid crystals.

16. Device according to claim 1, wherein said at least one of the optical gratings is embedded in at least one of the coatings in addition to being embedded in said core.

17. Device according to claim 1, wherein said means for coupling comprises parts or structures having an index of refraction different from the refractive index of said core.

18. Device according to claim 17, wherein said index of refraction different from the refractive index provides for deflection of the light by means of refraction.

* * * * *